United States Patent
Hatano et al.

(10) Patent No.: US 8,471,615 B2
(45) Date of Patent: *Jun. 25, 2013

(54) TIMING ADJUSTMENT CIRCUIT, SOLID-STATE IMAGE PICKUP ELEMENT, AND CAMERA SYSTEM

(75) Inventors: Masahiro Hatano, Kanagawa (JP); Masaru Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/328,378

(22) Filed: Dec. 16, 2011

(65) Prior Publication Data

US 2012/0086839 A1    Apr. 12, 2012

Related U.S. Application Data

(60) Continuation of application No. 12/929,246, filed on Jan. 11, 2011, now Pat. No. 8,093,934, which is a division of application No. 12/591,132, filed on Nov. 10, 2009, now Pat. No. 7,965,116.

(30) Foreign Application Priority Data

Nov. 27, 2008   (JP) ................................ 2008-303070

(51) Int. Cl.
    *H03L 7/06*    (2006.01)
(52) U.S. Cl.
    USPC .......................................... 327/158; 327/149
(58) Field of Classification Search
    USPC ................................................. 327/149, 158
    See application file for complete search history.

(56) References Cited

U.S. PATENT DOCUMENTS

| | | | |
|---|---|---|---|
| 5,982,241 A | 11/1999 | Nguyen et al. | |
| 6,236,695 B1 * | 5/2001 | Taylor | 375/372 |
| 6,696,872 B1 * | 2/2004 | Le et al. | 327/158 |
| 6,774,687 B2 * | 8/2004 | Gomm et al. | 327/158 |
| 6,954,093 B2 * | 10/2005 | Haringer et al. | 327/158 |
| 7,119,592 B2 * | 10/2006 | Cooper | 327/158 |
| 7,206,956 B2 * | 4/2007 | Johnson et al. | 713/401 |

(Continued)

FOREIGN PATENT DOCUMENTS

| | | |
|---|---|---|
| JP | 08-111675 A | 4/1996 |
| JP | 2003-264452 A | 9/2003 |

(Continued)

OTHER PUBLICATIONS

Japanese Office Action issued Dec. 18, 2012 for corresponding Japanese Application No. 2008-303070.

*Primary Examiner* — Adam Houston
(74) *Attorney, Agent, or Firm* — Rader Fishman & Grauer, PLLC

(57) ABSTRACT

A timing adjustment circuit includes at least one data line; a phase synchronization circuit that includes a plurality of oscillation delay elements which oscillate an oscillation signal, and that is configured to oscillate the oscillation signal by synchronizing a phase of a feedback clock with a phase of a reference clock; at least one delay circuit that includes a delay element which is disposed on the data line and which is equivalent to one of the plurality of oscillation delay elements, and that is configured to delay data which is to be transmitted on the data line; and a delay adjustment unit configured to adjust an amount of delay of the delay element of the delay circuit in accordance with a signal associated with oscillation of the phase synchronization circuit.

12 Claims, 11 Drawing Sheets

U.S. PATENT DOCUMENTS

| | | | |
|---|---|---|---|
| 7,319,345 B2 | 1/2008 | Farjad-rad et al. | |
| 7,328,115 B2 * | 2/2008 | Shipton et al. | 702/106 |
| 7,489,568 B2 * | 2/2009 | Kim et al. | 365/189.12 |
| 7,757,086 B2 | 7/2010 | Walmsley | |
| 7,773,153 B2 * | 8/2010 | FanChiang et al. | 348/536 |
| 7,830,194 B2 * | 11/2010 | Lin | 327/291 |
| 7,859,594 B2 | 12/2010 | Komatsu | |
| 1,010,265 A1 | 5/2011 | Hatano et al. | |
| 7,969,507 B2 * | 6/2011 | Kim | 348/537 |
| 8,059,200 B2 * | 11/2011 | Chen | 348/536 |
| 8,093,934 B2 * | 1/2012 | Hatano et al. | 327/158 |
| 2006/0197869 A1 * | 9/2006 | Wang et al. | 348/537 |
| 2007/0046344 A1 * | 3/2007 | Minzoni | 327/158 |
| 2008/0278363 A1 * | 11/2008 | Okumura | 341/155 |
| 2008/0303564 A1 * | 12/2008 | Feng | 327/153 |
| 2009/0109308 A1 * | 4/2009 | Fukushima | 348/294 |
| 2009/0274254 A1 | 11/2009 | Hirata | |
| 2010/0061406 A1 * | 3/2010 | Tatsuta et al. | 370/503 |
| 2010/0079611 A1 * | 4/2010 | Suzuki et al. | 348/222.1 |
| 2010/0091153 A1 | 4/2010 | Ogasawara et al. | |
| 2010/0103746 A1 * | 4/2010 | Ma | 365/189.05 |
| 2010/0127741 A1 * | 5/2010 | Hatano et al. | 327/153 |
| 2010/0142660 A1 * | 6/2010 | Schnarr | 375/344 |
| 2010/0165106 A1 * | 7/2010 | You | 348/148 |
| 2010/0244916 A1 * | 9/2010 | Kim | 327/158 |
| 2011/0025389 A1 * | 2/2011 | Ma | 327/158 |
| 2011/0102656 A1 * | 5/2011 | Hatano et al. | 348/302 |
| 2011/0141080 A1 * | 6/2011 | Ichimasa | 345/208 |
| 2011/0243290 A1 * | 10/2011 | Leach et al. | 375/376 |
| 2011/0292260 A1 * | 12/2011 | Hagihara | 348/294 |
| 2012/0002088 A1 * | 1/2012 | Fukushima | 348/294 |

FOREIGN PATENT DOCUMENTS

| | | |
|---|---|---|
| JP | 2005-134809 A | 5/2005 |
| JP | 2006-340090 A | 12/2006 |
| JP | 2007-538473 | 12/2007 |
| WO | WO-2007/145160 A1 | 12/2007 |

* cited by examiner

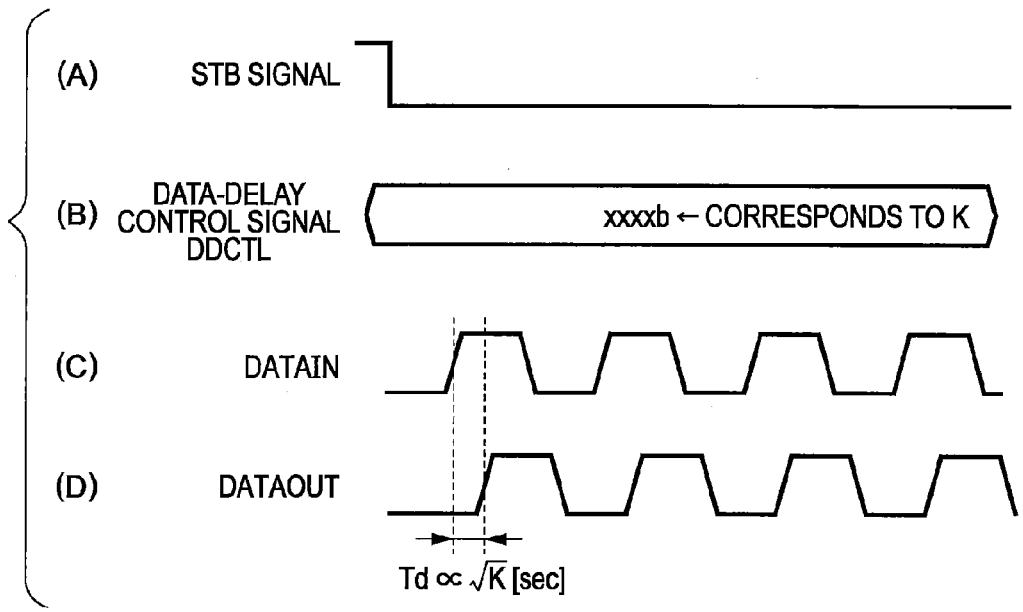
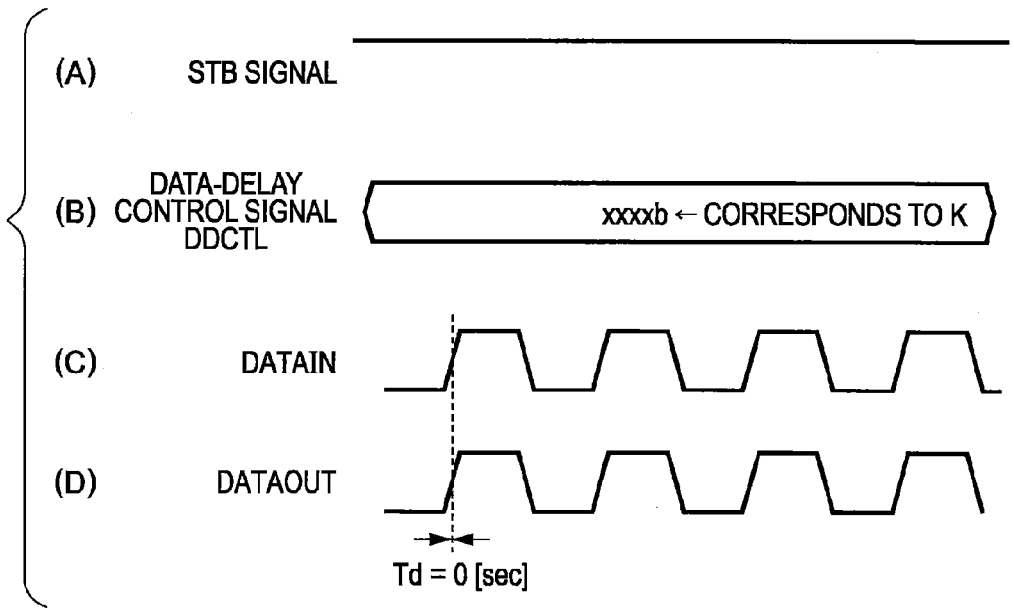

TIMING ADJUSTMENT CIRCUIT, SOLID-STATE IMAGE PICKUP ELEMENT, AND CAMERA SYSTEM

CROSS REFERENCES TO RELATED APPLICATIONS

This is a Continuation Application of patent application Ser. No. 12/929,246, filed Jan. 11, 2011, which is a Divisional Application of the patent application Ser. No. 12/591,132, filed Nov. 10, 2009, which claims priority from Japanese Patent Application No. 2008-303070 filed in the Japan Patent Office on Nov. 27, 2008, the entire contents of which being incorporated herein by reference.

BACKGROUND OF THE INVENTION

1. Field of the Invention

The present invention relates to a timing adjustment circuit, a solid-state image pickup element, and a camera system, such as a complementary metal-oxide semiconductor (CMOS) image sensor.

2. Description of the Related Art

In recent years, in addition to charge coupled devices (CCDs), CMOS image sensors have been broadly used for digital still cameras, camcorders, surveillance cameras, and so forth. The market for CMOS image sensors has expanded.

Such a CMOS image sensor converts light that enters individual pixels into electrons using photodiodes that are photoelectric conversion elements, and accumulates the electrons for a fixed period. Then, the CMOS image sensor digitizes a signal that is set in accordance with the amount of accumulated charge, and outputs the signal to an external digital signal processor (DSP) or the like.

Generally, for timing adjustment between a device and an external device, a delay-locked loop (DLL) circuit is used, which controls a delay time that occurs in an external interface due to wire load, and which performs adjustment for synchronization between signals on data lines and an internal clock.

However, in an image sensor, because of demand for increase in the number of pixels, it is necessary to minimize peripheral circuits excluding pixels, and it is difficult to mount a DLL circuit on each data line.

A delay circuit to which a technique that is disclosed in U.S. Pat. No. 5,982,241 is applied is proposed.

Regarding the delay circuit, generation of a delay time is performed with a high accuracy using a phase-locked loop (PLL), and the delay time is set in the delay circuit that is disposed on each data line.

In the delay circuit, the delay time can be controlled by controlling an oscillation frequency of the PLL. In a method using the delay circuit, an oscillator that is provided in the PLL is used as the delay circuit, whereby the small delay circuit having a high accuracy can be realized.

Furthermore, in Japanese Unexamined Patent Application Publication (Translation of PCT Application) No. 2007-538473, a wide range clock generator that can adjust a delay time for each data line is proposed.

SUMMARY OF THE INVENTION

However, regarding the above-described delay circuit to which the technique that is disclosed in U.S. Pat. No. 5,982,241 is applied, because a common control voltage is supplied to all of the delay circuits that are disposed on the individual data lines, it is difficult to adjust the delay times independently from one another for the individual data lines.

In the technique disclosed in Japanese Unexamined Patent Application Publication (Translation of PCT Application) No. 2007-538473, the delay time can be adjusted for each data line. However, because the adjustment range depends on an oscillation frequency of a PLL, it is necessary to cause the PLL to oscillate at a high frequency in order to perform timing adjustment with a high accuracy.

For example, when the minimum delay time is 50 ps, it is necessary to cause the PLL to oscillate at 5 GHz. In reality, it is difficult to design a PLL such as the PLL that oscillates at 5 GHz.

It is desirable to provide a timing adjustment circuit, a solid-state image pickup element, and a camera system that can adjust delay times independently from one another for individual data lines and that can adjust the delay times without depending on an oscillation frequency of a built-in PLL.

According to a first embodiment of the present invention, there is provided a timing adjustment circuit including at least one data line; a phase synchronization circuit that includes a plurality of oscillation delay elements which oscillate an oscillation signal, and that is configured to oscillate the oscillation signal by synchronizing a phase of a feedback clock with a phase of a reference clock; at least one delay circuit that includes a delay element which is disposed on the data line and which is equivalent to one of the plurality of oscillation delay elements, and that is configured to delay data which is to be transmitted on the data line; and a delay adjustment unit configured to adjust an amount of delay of the delay element of the delay circuit in accordance with a signal associated with oscillation of the phase synchronization circuit.

According to a second embodiment of the present invention, there is provided a solid-state image pickup element including a pixel section in which a plurality of pixels that perform photoelectric conversion are disposed in a matrix form; a pixel read section having a function of reading analog pixel signals from the pixel section, and of converting the read analog pixel signals into digital signals; and a timing adjustment circuit configured to be capable of adjusting delay timing of the digital signals that are obtained by the pixel read section. The timing adjustment circuit includes the following elements: at least one data line on which digital data that is obtained by the pixel read selection is transmitted; a phase synchronization circuit that includes a plurality of oscillation delay elements which oscillate an oscillation signal, and that is configured to oscillate the oscillation signal by synchronizing a phase of a feedback clock with a phase of a reference clock; at least one delay circuit that includes a delay element which is disposed on the data line and which is equivalent to one of the plurality of oscillation delay elements, and that is configured to delay data which is to be transmitted on the data line; and a delay adjustment unit configured to adjust an amount of delay of the delay element of the delay circuit in accordance with a signal associated with oscillation of the phase synchronization circuit.

According to a third embodiment of the present invention, there is provided a camera system including a solid-state image pickup element; an optical system configured to form an image of an object on the solid-state image pickup element; and a signal processing circuit configured to process an output image signal that is output from the sold-state image pickup element. The solid-state image pickup element includes the following elements: a pixel section in which a plurality of pixels that perform photoelectric conversion are disposed in a matrix form; a pixel read section having a function of reading analog pixel signals from the pixel section, and of converting the read analog pixel signals into digital signals; and a timing adjustment circuit configured to be capable of adjusting delay timing of the digital signals that are obtained by the pixel read section. The timing adjustment circuit includes the following elements: at least one data line on which digital data that is obtained by the pixel read selection is transmitted; a phase synchronization circuit that includes a plurality of oscillation delay elements which oscillate an oscillation signal, and that is configured to oscillate the oscillation signal by synchronizing a phase of a feedback clock with a phase of a reference clock; at least one delay circuit that includes a delay element which is disposed on the data line and which is equivalent to one of the plurality of oscillation delay elements, and that is configured to delay data which is to be transmitted on the data line; and a delay adjustment unit configured to adjust an amount of delay of the delay element of the delay circuit in accordance with a signal associated with oscillation of the phase synchronization circuit.

According to any one of the embodiments of the present invention, each of the delay circuits is disposed on a corresponding one of the data lines, and includes the delay element that is equivalent to one of the oscillation delay elements of the phase synchronization circuit.

The amount of delay of each of the delay circuits is adjusted by a corresponding one of the delay adjustment units in accordance with the signal associated with oscillation of the phase synchronization circuit.

According to any one of the embodiments of the present invention, the delay times can be adjusted independently from one another for the individual data lines. Furthermore, the delay times can be adjusted without depending on an oscillation frequency of a built-in PLL.

BRIEF DESCRIPTION OF THE DRAWINGS

FIG. 11 including parts (A) to (D) is a timing diagram in a case of a normal operation (not in a case of a standby operation);

FIG. 12 including parts (A) to (D) is a timing diagram in a case of the standby operation.

DESCRIPTION OF THE PREFERRED EMBODIMENTS

Hereinafter, embodiments of the present invention will be described with reference to the accompanying drawings.

Note that the embodiments will be described in the order of section headings as follows:
1. First Embodiment (an example of a configuration of a solid-state image pickup element including a timing adjustment circuit)
2. Second Embodiment (a camera system)

1. First Embodiment

Figure 1:
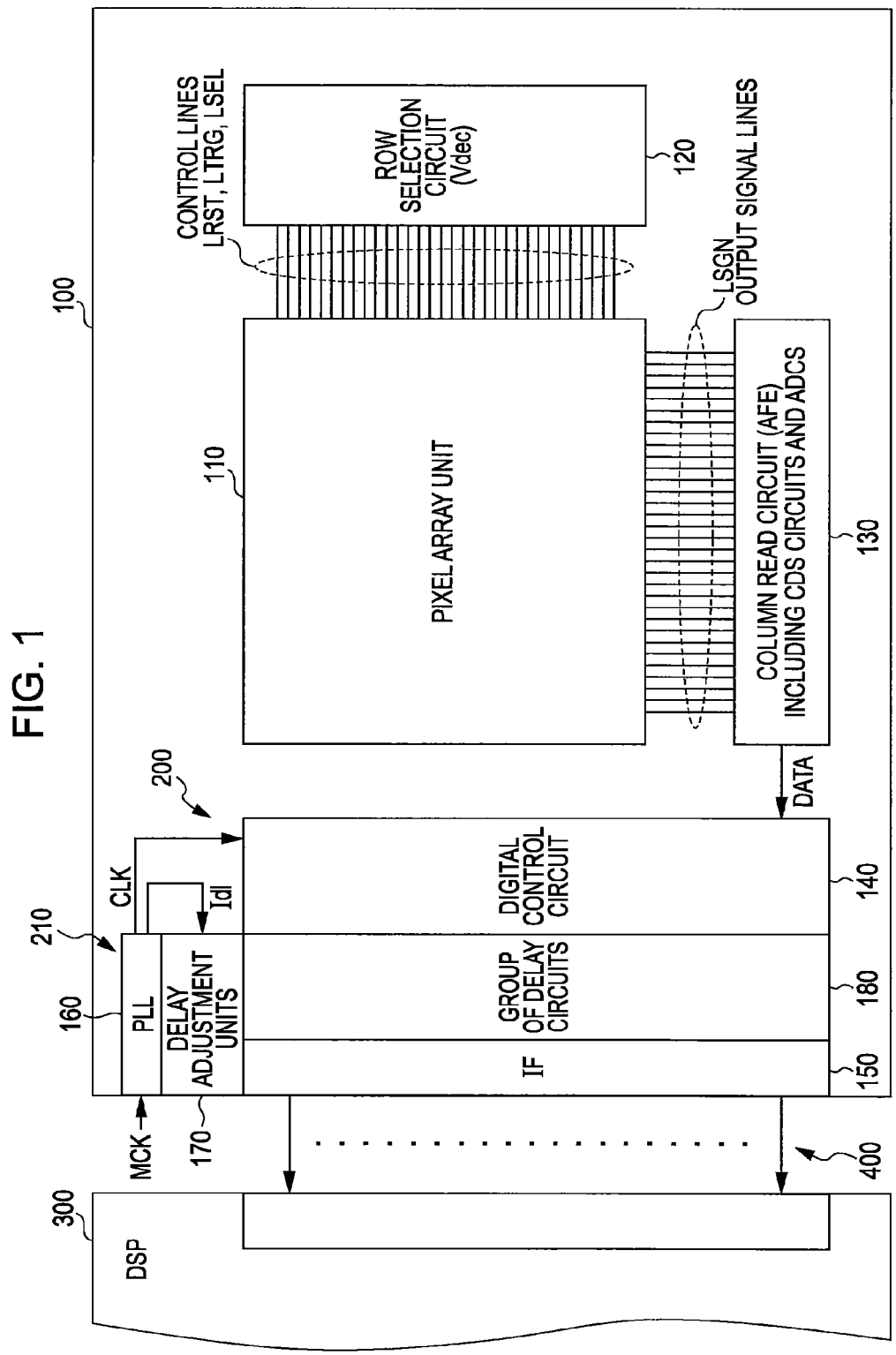
FIG. 1 is a diagram showing an example of a configuration of a CMOS image sensor (a solid-state image pickup element), in which a data transfer circuit is employed, according to a first embodiment of the present invention.

FIG. 1 is a diagram showing an example of a configuration of a CMOS image sensor (a solid-state image pickup element), in which a data transfer circuit is employed, according to a first embodiment of the present invention.

Figure 2:
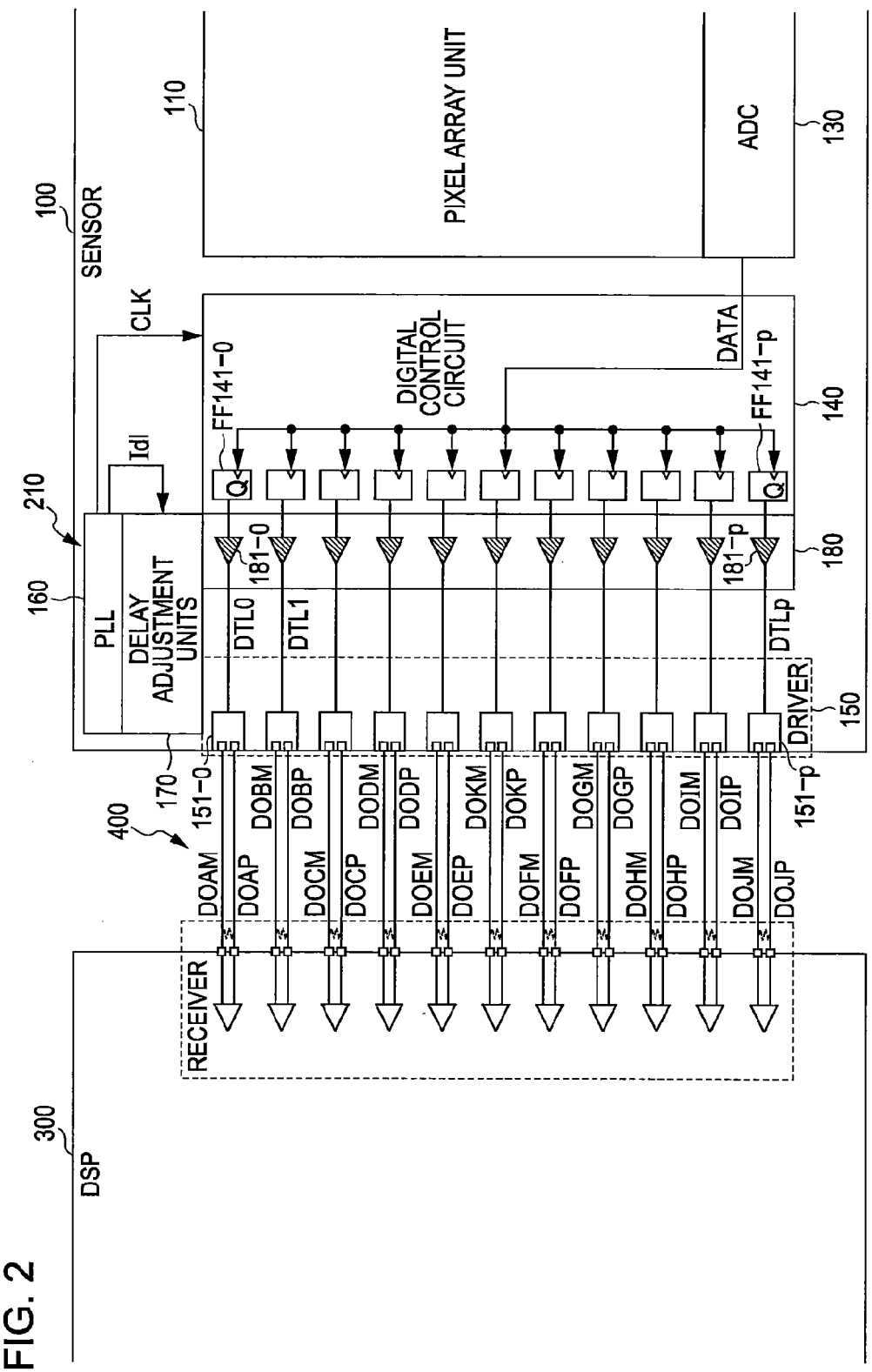
FIG. 2 is a diagram showing an example of a more detailed configuration of the data transfer circuit shown in FIG. 1 and an example of a connection state between the data transfer circuit and a DSP.

FIG. 2 is a diagram showing an example of a more detailed configuration of the data transfer circuit shown in FIG. 1 and an example of a connection state between the data transfer circuit and a DSP.

A CMOS image sensor 100 includes a pixel array unit 110, a row selection circuit (Vdec) 120 and a column read circuit (AFE) 130 that serve as pixel drive units. A pixel signal read section is configured using the row selection circuit 120 and the column read circuit 130.

The CMOS image sensor 100 includes a digital control circuit 140, an output interface unit (IF) 150, a PLL circuit 160 that is a phase synchronization circuit, delay adjustment units (current adjustment units) 170, and a group of delay circuits 180. A data transfer circuit 200 for digital data is configured using the digital control circuit 140, the output interface unit 150, the PLL circuit 160, the delay adjustment units (current adjustment units) 170, and the group of delay circuits 180.

Furthermore, a delay timing adjustment circuit 210 is configured using the PLL circuit 160, the delay adjustment units (current adjustment units) 170, and the group of delay circuits 180.

The delay timing adjustment circuit 210 is disposed between the digital control circuit 140 and the output interface unit 150.

Additionally, the CMOS image sensor 100 is connected to a DSP 300 using transmission lines 400, and transfers digital data to the DSP 300.

The data transfer circuit 200 in the first embodiment includes the built-in PLL circuit 160. In the group of delay circuits 180, each of delay circuits is disposed on a corresponding one of data lines. The delay circuit uses a delay element that is equivalent to one of oscillation delay elements which are provided in the PLL circuit 160.

Accordingly, the data transfer circuit 200 can generate delay times that are not influenced by fluctuation in temperature, fluctuation in power supply voltage, and variations in thresholds of transistors. The delay times can also be set independently from one another so that each of the delay times is provided for a corresponding one of the data lines.

In the data transfer circuit 200, each of the delay circuits, which is disposed on a corresponding one of the data lines, has a built-in delay time adjustment function. The data transfer circuit 200 is configured to be capable of adjusting the delay times independently from one another so that each of the delay times is provided for a corresponding one of data channels.

Accordingly, the data transfer circuit 200 can adjust the delay times without depending on an oscillation frequency of the built-in PLL circuit 160.

The more specific configuration and function of the data transfer circuit 200 having the above-mentioned characteristics will be describe below.

In the pixel array unit 110, a plurality of pixel circuits 110A are arranged in a two-dimensional form of m rows×n columns (in a matrix form).

Each of the pixel circuits 110A in the first embodiment basically includes a photoelectric conversion element, a transfer transistor, a reset transistor, an amplification transistor, a row selection transistor, and a floating diffusion (FD) part.

In the pixel array unit 110, a group of a transfer control line LTRG, a reset control line LRST, and a row selection line LSEL is disposed for each of rows in the pixel array unit 110 in which pixels are arranged.

Regarding the number of control lines, m transfer control lines LTRG, m reset control lines LRST, and m row selection lines LSEL are provided.

The transfer control lines LTRG, the reset control lines LRST, and the row selection lines LSEL are driven by the row selection circuit 120.

Figure 3:
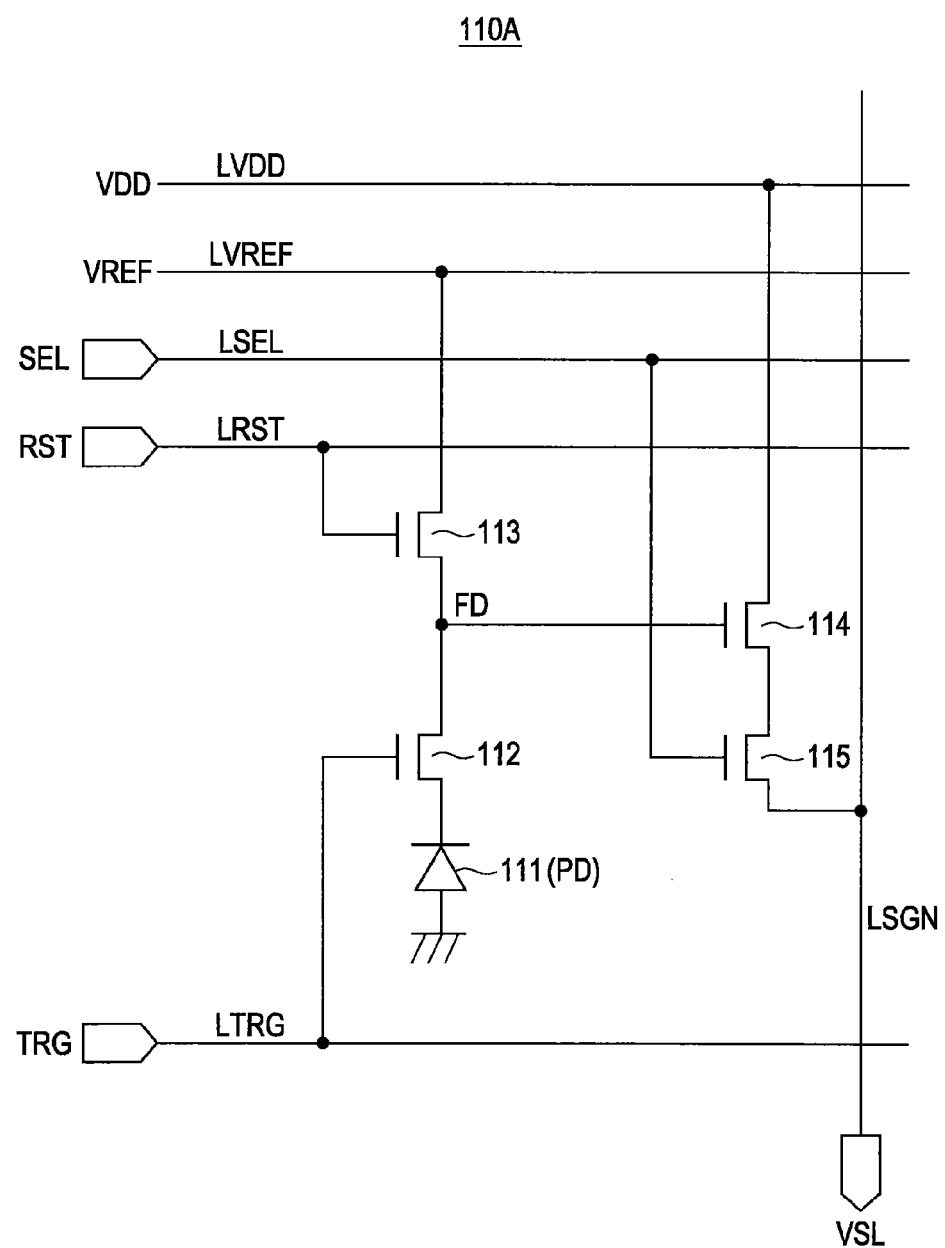
FIG. 3 is a diagram showing an example of each of pixels of the CMOS image sensor according to the first embodiment, the pixel including four transistors.

FIG. 3 is a diagram showing an example of each of the pixels of the CMOS image sensor according to the first embodiment, the pixel including four transistors.

The pixel circuit 110A includes a photoelectric conversion element 111 that is configured, for example, a photodiode.

The pixel circuit 110A includes, for the one photoelectric conversion element 111, four transistors, i.e., a transfer transistor 112, a reset transistor 113, an amplification transistor 114, and a selection transistor 115, as active elements.

The photoelectric conversion element 111 performs photoelectric conversion to convert incident light into charge (electrons in this example) so that the amount of the charge is provided in accordance with the amount of the incident light.

The transfer transistor 112 is connected between the photoelectric conversion element 111 and the floating diffusion part FD that serves as an output node. A transmission signal TRG that is a control signal is supplied to the gate (transfer gate) of the transfer transistor 112 via the transfer control line LTRG.

Accordingly, the transfer transistor 112 transfers, to the floating diffusion part FD, electrons that are obtained by photoelectric conversion performed by the photoelectric conversion element 111.

The reset transistor 113 is connected between a reference voltage line LVREF and the floating diffusion part FD. A reset signal RST that is a control signal is supplied to the gate of the reset transistor 113 via the reset control line LRST.

Accordingly, the reset transistor 113 resets the potential of the floating diffusion part FD to be the potential of the reference voltage line LVREF.

The gate of the amplification transistor 114 is connected to the floating diffusion part FD. The amplification transistor 114 is connected to an output signal line LSGN via the selection transistor 115. A source follower is configured using the amplification transistor 114 and a constant current source that is provided outside the pixel.

A selection signal SEL that is a control signal which is provided in accordance with a corresponding address signal is supplied to the gate of the selection transistor 115 via the row selection line LSEL, whereby the selection transistor 115 is turned on.

When the selection transistor 115 is turned on, the amplification transistor 114 amplifies the potential of the floating diffusion part FD, and outputs a voltage corresponding to the potential to the output signal line LSGN. The voltage that is output from each of the pixels via the output signal line LSGN is output to the column read circuit 130.

For example, the gates of the transfer transistors 112 in each of the rows are connected to one another, the gates of the reset transistors 113 in each of the rows are connected to one another, and the gates of the row selection transistors 115 in each of the rows are connected to one another. Accordingly, the above-described operation is simultaneously performed on the individual pixels in one row.

The row selection circuit 120 controls an operation of the pixels that are disposed in each of the rows which are provided in the pixel array unit 110. The row selection circuit 120 controls the pixel circuits 110A in the row via the transfer control line LTRG, the reset control line LRST, and the row selection line LSEL.

The pixels in the row are controlled by the row selection circuit 120 so that data items of the pixels in the row are read. The column read circuit 130 receives the data items via the output signal lines LSGN, and transfers the data items to the digital control circuit 140 that is provided at a stage subsequent to the column read circuit 130.

The column read circuit 130 includes correlated double sampling (CDS) circuits and analog-to-digital converters (ADCs).

Hereinafter, the more detailed configuration and function of the data transfer circuit 200 in the first embodiment will be described.

The digital control circuit 140 latches, in synchronization with a clock signal that is generated by the PLL circuit 160, digital data items that are supplied from the column read circuit 130. The digital control circuit 140 outputs the latched digital data items.

The digital control circuit 140 includes a plurality of output channels as shown in FIG. 2. The digital control circuit 140 includes flip-flops (FFs), i.e., FF141-0 to FF141-$p$, each of which is disposed on a corresponding one of data lines DTL0 to DTLp.

An output Q of each of the FF141-0 to FF141-$p$ is connected to a corresponding one of the data lines DTL0 to DTLp. Each of the FF141-0 to FF141-$p$ outputs a corresponding one of the latched digital data items to a corresponding one of the data lines DTL0 to DTLp.

The digital data items are output from the digital control circuit 140. Delay adjustment is performed on the individual data lines DTL0 to DTLp by the group of delay circuits 180, thereby performing timing adjustment on the digital data items. The output interface (IF) unit 150 transfers the digital data items to the transmission lines 400.

The output interface unit 150 includes drivers 151-0 to 151-$p$, each of which is disposed on a corresponding one of the data lines DTL0 to DTLp.

Each of the drivers 151-0 to 151-$p$ converts a single signal into differential signals, and outputs the differential signals to the corresponding transmission lines 400.

Figure 4:
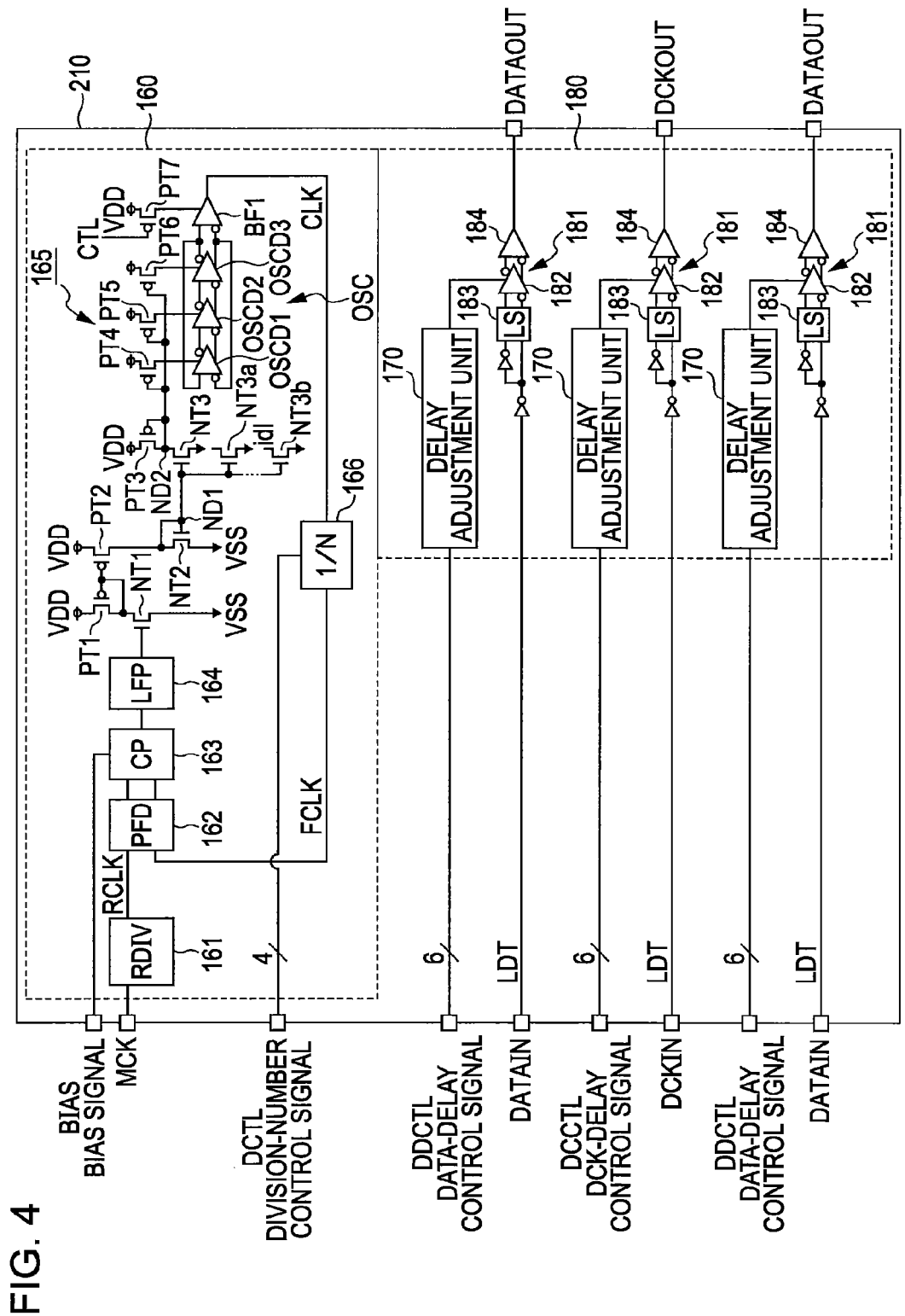
FIG. 4 is a circuit diagram showing an example of a configuration of a delay timing adjustment circuit, which includes a PLL circuit, delay adjustment units (current adjustment units), and a group of delay circuits in the data transfer circuit, according to the first embodiment.

FIG. 4 is a circuit diagram showing an example of a configuration of the delay timing adjustment circuit 210, which includes the PLL circuit 160, the delay adjustment units 170, and the group of delay circuits 180 in the data transfer circuit 200, according to the first embodiment.

A reference clock RCLK is generated by frequency division using a master clock MCK. The PLL circuit 160 generates an oscillation signal CLK so that the phase of the oscillation signal CLK is synchronized with the phase of the reference clock RCLK. The PLL circuit 160 supplies the oscillation signal CLK to the digital control circuit 140, and supplies a current Idl to the delay adjustment units 170.

The PLL circuit 160 includes an input frequency divider (RDIV) 161, a phase comparator (PFD) 161, a charge pump (CP) 163, a loop filter (LPF) 164, a voltage control oscillator (VCO) 165, and a feedback frequency divider (1/N) 166 as shown in FIG. 4.

In the PLL circuit 160, the master clock MCK is supplied from an external unit to the input frequency divider 161. A bias signal BIAS is supplied from an external unit to the charge pump 163. A division-number control signal DCTL is supplied from an external unit to the feedback frequency divider 166.

The input frequency divider 161 performs frequency division using the master clock MCK to obtain the reference clock RCLK so that the frequency of the reference clock RCLK is equal to a comparison frequency. The input frequency divider 161 outputs the reference clock RCLK to the phase comparator 162.

The phase comparator 162 detects the phase difference between the reference clock RCLK and a feedback clock FCLK that is supplied from the feedback frequency divider 166, and outputs a result of the phase difference to the charge pump 163.

The charge pump 163 and the loop filter 164 convert the result of the phase difference, which has been input, from a result based on a time axis to a result based on a voltage axis. The loop filter 164 outputs a voltage signal to the voltage control oscillator 165.

The voltage control oscillator 165 receives, as an input, the voltage signal that is obtained by the loop filter 164, and determines a current that is to flow through an oscillator. The voltage control oscillator 165 oscillates at a frequency that is set in accordance with the voltage signal, and outputs the oscillation signal CLK to the feedback frequency divider 166.

The feedback frequency divider 166 performs frequency division to obtain an oscillation signal so that the frequency of the oscillation signal is equal to a frequency which is obtained by dividing the frequency of the oscillation signal CLK by N. The feedback frequency divider 166 supplies, as the feedback clock FCLK to the phase comparator 162, the oscillation signal that is obtained by the frequency division.

The voltage control oscillator 165 shown in FIG. 4 includes p-channel metal-oxide-semiconductor (MOS) (PMOS) transistors PT1 to PT7, n-channel MOS (NMOS) transistors NT1 to NT3, oscillation delay elements OSCD1 to OSCD3, and an output buffer BF1.

The sources of the PMOS transistors PT1 and PT2 are connected to a source supplying a power supply voltage VDD. The sources of the NMOS transistors NT1 and NT2 are connected to a source of a reference potential VSS.

The drain of the PMOS transistor PT1 is connected to the drain of the NMOS transistor NT1 at a connection point. The connection point is connected to the gates of the PMOS transistors PT1 and PT2.

The gate of the NMOS transistor NT1 is connected to an output of the loop filter 164 from which the voltage signal is output. In other words, an input portion of the voltage control oscillator 165 is configured using the gate of the NMOS transistor NT1.

The drain of the PMOS transistor PT2 is connected to the drain and gate of the NMOS transistor NT2 at a connection point. A node ND1 is configured using the connection point.

A current mirror circuit is configured using the PMOS transistors PT1 and PT2 and the NMOS transistors NT1 and NT2.

The source of the PMOS transistor PT3 is connected to the source supplying the power supply voltage VDD. The drain of the PMOS transistor PT3 is connected to the drain of the NMOS transistor NT3 at a connection point. A node ND2 is configured using the connection point. The source of the NMOS transistor NT3 is connected to the source of the reference potential VSS.

The gate of the NMOS transistor NT3 is connected to the node ND1. The node ND2 is commonly connected to the gates of the PMOS transistors PT3 to PT6.

A current mirror circuit is configured using the PMOS transistors PT3 to PT6 and the NMOS transistors NT2 and NT3.

The current Idl flows at the node ND2.

Furthermore, NMOS transistors NT3-0 to NT3-$p$ are connected in parallel to the NMOS transistor NT3 at the node ND1. The number of NMOS transistors from NT3-0 to NT3-$p$ is equal to the number of data channels. The current Idl, which flows through the drains of the individual NMOS transistors NT3-0 to NT3-$p$, is supplied to the current adjustment units 170.

Each of the NMOS transistors NT3-0 to NT3-$p$ may be disposed in a corresponding one of the current adjustment units 170 that are disposed for the individual channels.

The sources of the PMOS transistors PT4 to PT6 are connected to the source supplying the power supply voltage VDD. The drains of the PMOS transistors PT4 to PT6 are connected to the oscillation delay elements OSCD1 to OSCD3 serving as differential pairs, respectively.

Each of the oscillation delay elements OSCD1 to OSCD3 is configured using a differential circuit having a positive input and a negative input, and a negative output and a positive output. Each of the PMOS transistors PT3 to PT6 functions as a current source for a corresponding one of the oscillation delay elements OSCD1 to OSCD3.

The oscillation delay elements OSCD1 to OSCD3 that are provided at three stages are cascaded so that a positive input and a negative input, and a negative output and a positive output are alternately provided. Outputs at the final stage are fed back to outputs at the first stage, thereby configuring an oscillation loop.

More specifically, the negative output of the oscillation delay element OSCD1, which is provided at the first stage, is connected to the positive input of the oscillation delay element OSCD2, which is provided at the second stage. The positive output of the oscillation delay element OSCD1, which is provided at the first stage, is connected to the negative input of the oscillation delay element OSCD2, which is provided at the second stage.

The negative output of the oscillation delay element OSCD2, which is provided at the second stage, is connected to the positive input of the oscillation delay element OSCD3, which is provided at the final stage. The positive output of the oscillation delay element OSCD2, which is provided at the second stage, is connected to the negative input of the oscillation delay element OSCD3, which is provided at the final stage.

The negative output of the oscillation delay element OSCD3, which is provided at the final stage, is connected to the positive input of the oscillation delay element OSCD1, which is provided at the first stage. The positive output of the oscillation delay element OSCD3, which is provided at the final stage, is connected to the negative input of the oscillation delay element OSCD1, which is provided at the first stage.

In this manner, the oscillation delay elements OSCD1 to OSCD3 that are provided at the plural stages (basically, an odd number of stages) are connected as a loop, thereby configuring an oscillation part OSC of the voltage control oscillator 165.

The source of the PMOS transistor PT7 is connected to the source supplying the power supply voltage VDD. The drain of the PMOS transistor PT7 is connected to the output buffer BF1 serving as a differential pair. The gate of the PMOS transistor PT7 is connected to a line on which a control signal CTL is supplied.

The output buffer BF1 is configured using a differential circuit having a positive input and a negative input, and one positive output. The PMOS transistor PT7 functions as a current source for the output buffer BF1.

The positive input of the output buffer BF1 is connected to the negative output of the oscillation delay element OSCD3, which is provided at the final stage of the oscillation part OSC. The negative input of the output buffer BF1 is connected to the positive output of the oscillation delay element OSCD3.

The output buffer BF1 converts differential outputs from the oscillation part OSC into a single signal that is the oscillation signal CLK, and outputs the oscillation signal CLK to the feedback frequency divider 166.

The voltage signal is received at the node ND1 of the voltage control oscillator 165 of the PLL circuit 160, and the current Idl is supplied to the PMOS transistors PT4 to PT6, which serve as current sources for the oscillation delay elements OSCD1 to OSCD3. Each of the current adjustment units 170 has a function of generating, as an adjustment signal, a current that is set in accordance with the current Idl, i.e., a current mirror function.

The current adjustment unit 170 generates a current Iosc that is set in accordance with the supplied current Idl, and supplies the current Iosc as an adjustment signal to a delay element of a corresponding delay circuit 181.

The current adjustment unit 170 can slightly adjust a current in accordance with a data-delay control signal DDCTL or a data-clock-delay control signal DCCTL that is supplied from an external unit.

The group of delay circuits 180 includes delay circuits 181-0 to 181-p, and each of the delay circuits 181-0 to 181-p is disposed on a corresponding one of the data lines DTL0 to DTLp.

Each of the delay circuits 181-0 to 181-p adjusts an amount of delay of a data item in accordance with an amount of delay that is set in accordance with the current Iosc which is supplied from a corresponding one of the current adjustment units 170, and outputs the data item to a corresponding one of the drivers 151-0 to 151-p of the output interface unit 150.

Figure 5:
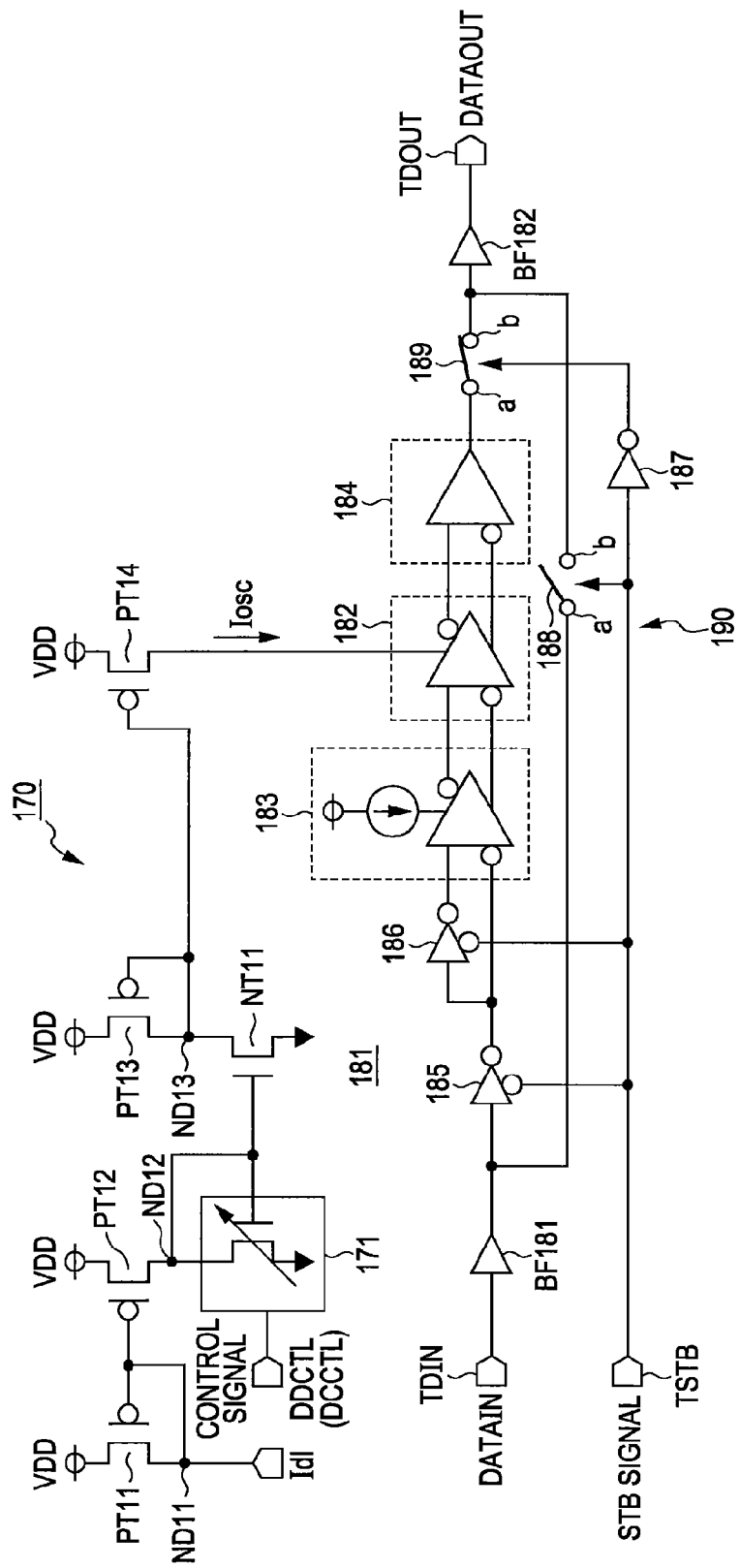
FIG. 5 is a diagram showing an example of a configuration of the current adjustment unit and a delay circuit for one channel in the first embodiment.

FIG. 5 is a diagram showing an example of a configuration of the current adjustment unit 170 and the delay circuit 181 for one channel in the first embodiment.

The current adjustment unit 170 shown in FIG. 5 includes PMOS transistors PT11 to PT14, an adjustable gate part 171 that can adjust a mirror ratio, and an NMOS transistor NT11.

The sources of the PMOS transistors PT11 to PT14 are connected to the source supplying the power supply voltage VDD. The source of the NMOS transistor NT11 is connected to the source of the reference potential VSS.

The drain of the PMOS transistor PT11 is connected, at a node ND11, to a line on which the current Idl is supplied. The node ND11 is connected to the gate of the PMOS transistor PT11 and the gate of the PMOS transistor PT12.

The drain of the PMOS transistor PT12 is connected to the adjustable gate part 171 at a node ND12. The node ND12 is connected to the gate of the NMOS transistor NT11.

The drain of the PMOS transistor PT13 is connected to the drain of the NMOS transistor NT11 at a node ND13. The node ND13 is connected to the gate of the PMOS transistor PT13 and the gate of the PMOS transistor PT14.

The current Iosc is supplied from the drain of the PMOS transistor PT14 to the delay element of the delay circuit 181. In other words, the PMOS transistor PT14 is shared as a current source with the delay circuit 181.

A current mirror circuit is configured using the adjustable gate part 171 in which an NMOS transistor NT12 is used as a core. The adjustable gate part 171 is configured to be capable of adjusting a mirror ratio of the current mirror circuit in accordance with the data-delay control signal DDCTL or the data-clock-delay control signal DCCTL which is supplied from an external unit.

Figure 6:
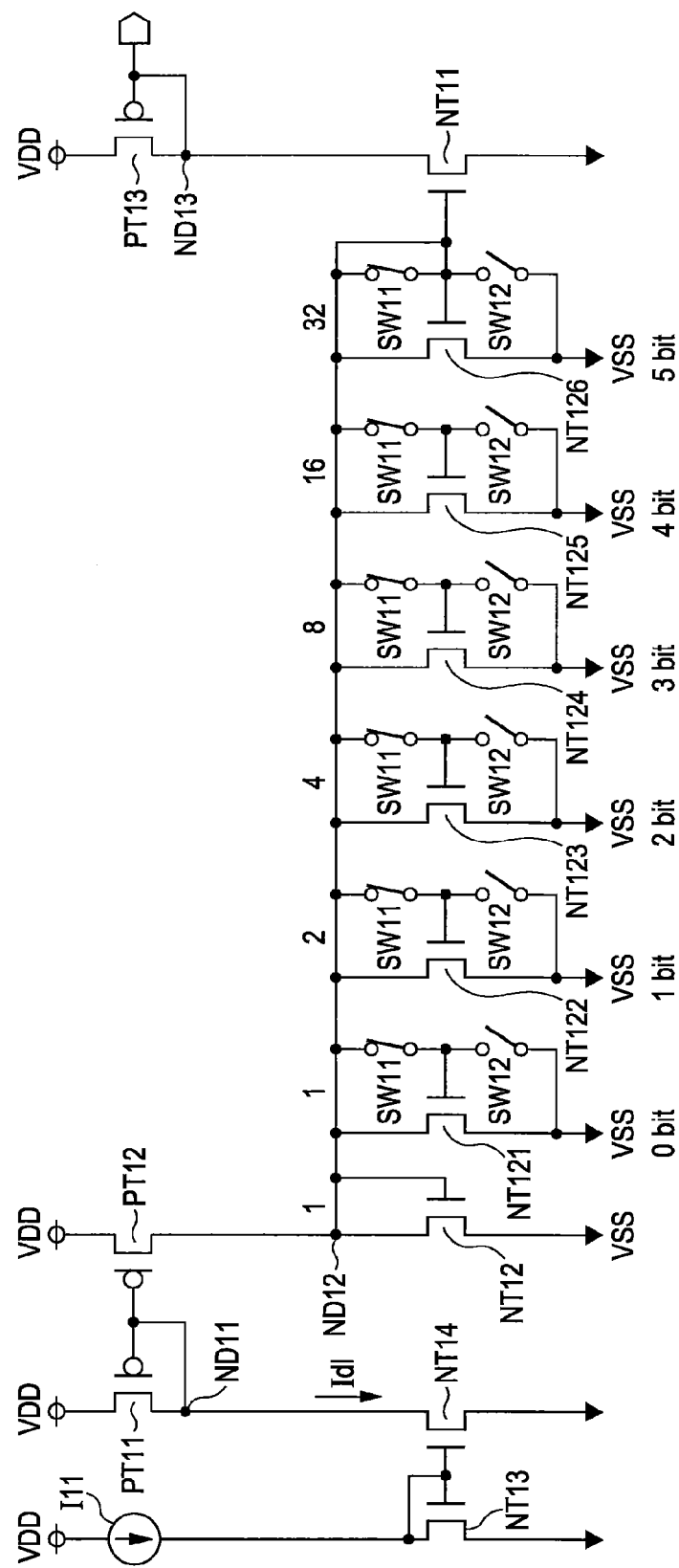
FIG. 6 is a circuit diagram showing an example of the more detailed configuration of the current adjustment unit in the first embodiment.

FIG. 6 is a circuit diagram showing an example of a more detailed configuration of the current adjustment unit 170 in the first embodiment.

Note that, in FIG. 6, a configuration is provided, in which the current Idl is supplied using a current mirror circuit that is configured using a current source I11, and NMOS transistors NT13 and NT14.

The adjustable gate part 171 shown in FIG. 6 includes the NMOS transistor NT12 and NT121 to NT126 that are connected in parallel between the node ND12 and the source of the reference potential VSS.

The gate of the NMOS transistor NT12 is directly connected to the node ND12.

A switch SW11 and a switch SW12 are connected to the gate of each of the NMOS transistors NT121 to NT126. The switch SW11 causes the gate of a corresponding one of the NMOS transistors NT121 to NT126 and the node ND12 to be selectively connected to each other. The switch SW12 causes the gate of a corresponding one of the NMOS transistors NT121 to NT126 and the source of the reference potential VSS to be selectively connected to each other.

One of the switches SW11 and SW12 is turned on or off in accordance with the data-delay control signal DDCTL that is a six-bit signal, and the other is turned off or on.

For example, when a corresponding bit is one, the switch SW11 is turned on, and the switch SW12 is turned off. In contrast, when the corresponding bit is zero, the switch SW11 is turned off, and the switch SW12 is turned on.

Accordingly, a mirror ratio K of the current mirror function is adjusted, and the current Iosc is slightly adjusted in accordance with the mirror ratio K.

Each of the delay circuits 181-0 to 181-p in the group of delay circuits 180 includes a delay element 182, an input level shifter 183, an output level shifter 184, clocked inverters 185 and 186, an inverter 187, and switches 188 and 189 as shown in FIG. 5.

A bypass circuit 190 is configured using the switches 188 and 189 and the inverter 187.

The delay circuit 181 includes buffers BF181 and BF182, a data input terminal TDIN, an input terminal TSTB for a standby signal STB, and an output terminal TDOUT.

In the first embodiment, the standby signal STB is active high. In a case of a normal operation (not in a case of a standby operation), the level of the standby signal STB is set to be low.

An input of the buffer BF181 is connected to the data input terminal TDIN, and an output of the buffer BF181 is connected to an input of the clocked inverter 185 and a terminal a of the switch 188. A terminal b of the switch 188 is connected to a terminal b of the switch 189 and an input of the buffer BF182.

An output of the clocked inverter 185 is connected to an input of the clocked inverter 186 and a negative input of the input level shifter 183. An output of the clocked inverter 186 is connected to a positive input of the input level shifter 183.

Control terminals of the clocked inverters 185 and 186 are connected to the input terminal TSTB for the standby signal STB.

A positive output of the input level shifter 183 is connected to a negative input of the delay element 182, and a negative output of the input level shifter 183 is connected to a positive input of the delay element 182. A positive output of the delay element 182 is connected to a negative input of the output level shifter 184, and a negative output of the delay element 182 is connected to a positive input of the output level shifter 184.

An output of the output level shifter 184 is connected to a terminal a of the switch 189. The terminal b of the switch 189 is connected to the input of the buffer BF182. An output of the buffer BF182 is connected to the output terminal TDOUT.

Furthermore, a control terminal of the switch 188 and an input of the inverter 187 are connected to the input terminal TSTB for the standby signal STB. An output of the inverter 187 is connected to a control terminal of the switch 189.

The delay element 182 is configured using a delay element that is equivalent to one of the cascaded oscillation delay elements OSCD1, OSCD2, and OSCD3, which are provided at the three stages in the voltage control oscillator 165 of the PLL circuit 160, e.g., the oscillation delay element OSCD2.

The delay element 182 receives the current Iosc from the current adjustment unit 170. The delay element 182 delays a data item that is output from the input level shifter 183 by an amount of delay which is set in accordance with the value of the current Iosc, and outputs the delayed data item to the output level shifter 184.

Figure 7:
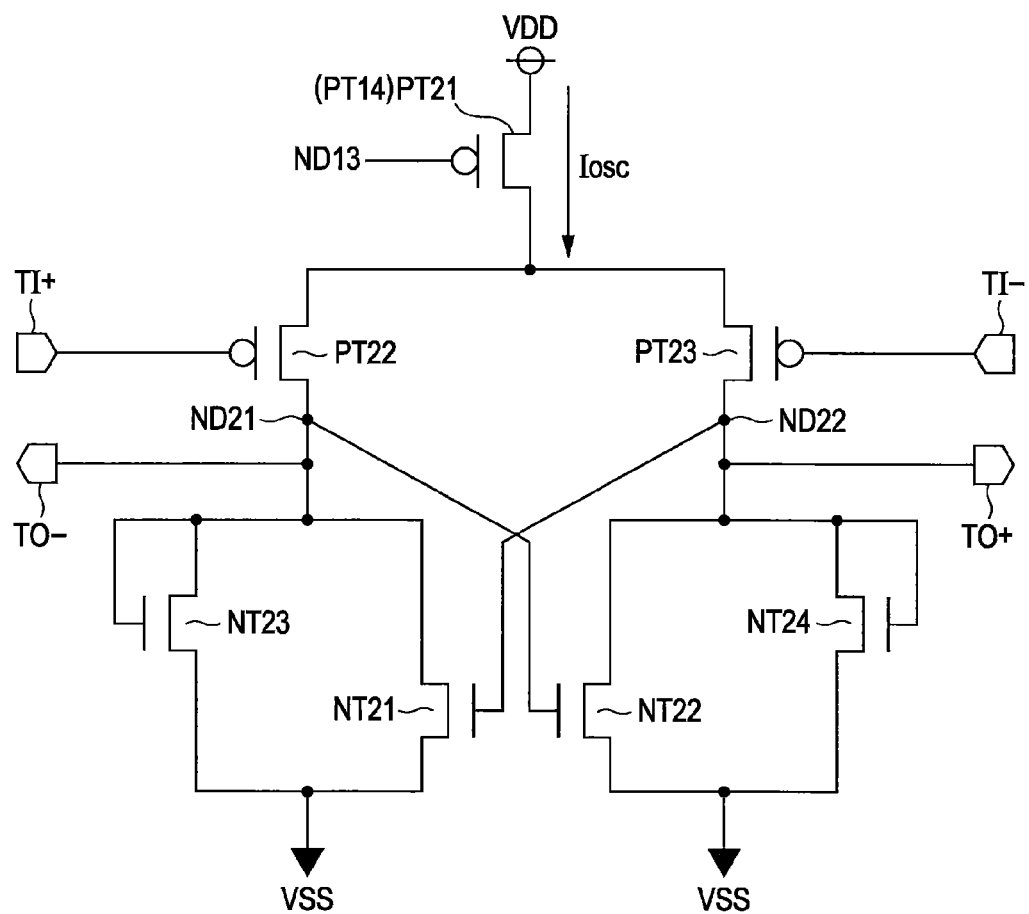
FIG. 7 is a circuit diagram showing an example of a configuration of a delay element that is applied in the delay circuit in the first embodiment.

FIG. 7 is a circuit diagram showing an example of a configuration of the delay element 182 that is applied in the delay circuit 181 in the first embodiment.

The delay element 182 shown in FIG. 7 includes PMOS transistors PT21 to PT23, NMOS transistors NT21 to NT24, input terminals TI+ and TI−, and output terminals TO+ and TO−.

Note that, in the delay element 182, the PMOS transistor PT21, which serves as a current source, corresponds to the PMOS transistor PT14 that is shared with the current adjustment unit 170 shown in FIG. 5.

The source of the PMOS transistor PT21 is connected to the source supplying the power supply voltage VDD. The drain of the PMOS transistor PT21 is connected to the sources of the PMOS transistors PT22 and PT23.

The gate of the PMOS transistor PT21 is connected to a node ND13 as shown in FIG. 5.

The drain of the PMOS transistor PT22 is connected to the drains of the NMOS transistor NT21 and NT23 at a connection point. A node ND21 is configured using the connection point. The gate of the PMOS transistor PT22 is connected to the positive input terminal TI+, and the node ND21 is connected to the negative output terminal TO−. As described above, the positive input terminal TI+ is connected to the negative output of the input level shifter 183, and the negative output terminal TO− is connected to the positive input of the output level shifter 184.

The drain of the PMOS transistor PT23 is connected to the drains of the NMOS transistors NT22 and NT24 at a connection point. A node ND23 is configured using the connection point. The gate of the PMOS transistor PT23 is connected to the negative input terminal TI−, and the node ND22 is connected to the positive output terminal TO+. As described above, the negative input terminal TI− is connected to the positive output of the input level shifter 183, and the positive output terminal TO+ is connected to the negative input of the output level shifter 184.

The sources of the NMOS transistors NT21 and NT23 are connected to the source of the reference potential VSS. The gate of the NMOS transistor NT21 is connected to the node ND22. The gate of the NMOS transistor NT23 is connected to the drain thereof and the node ND21. The NMOS transistor NT23 is diode-connected, and functions as a limiter with which the potential of the node ND21 is held so that the potential of the node ND21 is a predetermined potential.

The sources of the NMOS transistors NT22 and NT24 are connected to the source of the reference potential VSS. The gate of the NMOS transistor NT22 is connected to the node ND21. The gate of the NMOS transistor NT24 is connected to the drain thereof and the node ND22. The NMOS transistor NT24 is diode-connected, and functions as a limiter with which the potential of the node ND22 is held so that the potential of the node ND22 is a predetermined potential.

The delay element 182 having the above-described configuration inverts the level of a voltage corresponding to a data item that is input to the positive input terminal TI+, and outputs the data item from the negative output terminal TO−. Additionally, the delay element 182 inverts the level of a voltage corresponding to a data item that is input to the negative input terminal TI−, and outputs the data item from the positive output terminal TO+. Thus, the delay element 182 performs an operation of inverting the levels.

A time taken to process the operation of inverting the levels is adjusted in accordance with the value of the current Iosc that is supplied from the current adjustment unit 170.

The input level shifter 183 adjusts the amplitudes of voltages corresponding to input data items which are output from the clocked inverters 185 and 186 so that the amplitudes fall within an input voltage range of the delay element 182 (osc) which is provided at a stage subsequent to the input level shifter 183. The input level shifter 183 outputs, to the delay element 182, the data items corresponding to the voltages whose amplitudes are adjusted.

For example, the input voltage range of the delay element 182 is a range from a maximum voltage value VMAX and a minimum voltage value VMIN.

Figure 8:
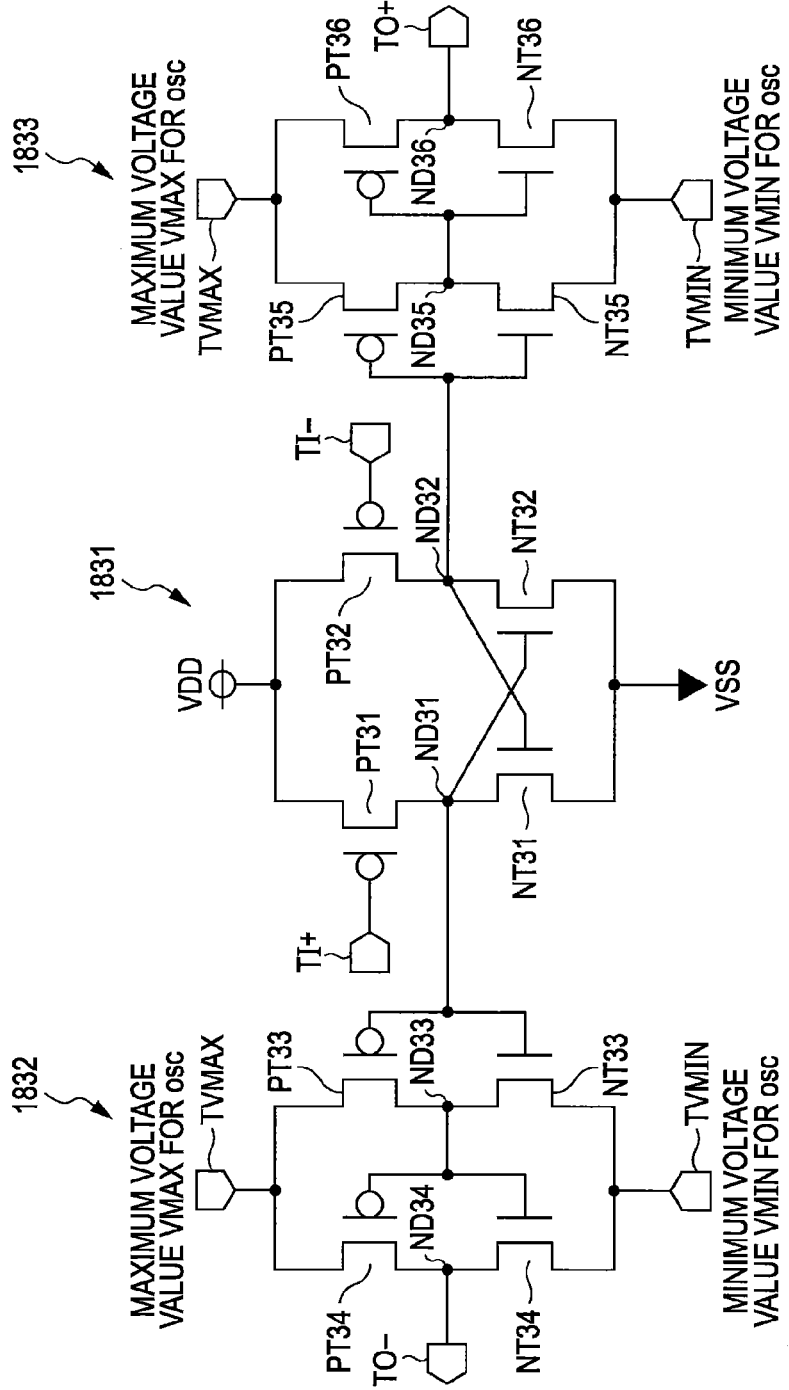
FIG. 8 is a circuit diagram showing an example of a configuration of an input level shifter that is applied in the delay circuit in the first embodiment.

FIG. 8 is a circuit diagram showing an example of a configuration of the input level shifter 183 that is applied in the delay circuit 181 in the first embodiment.

The input level shifter 183 includes an input differential circuit 1831, and output buffer parts 1832 and 1833.

The input differential circuit 1831 includes PMOS transistors PT31 and PT32, NMOS transistors NT31 and NT32, a positive input terminal TI+, and a negative input terminal TI−.

The sources of the PMOS transistors PT31 and PT32 are connected to the source supplying the power supply voltage VDD. The sources of the NMOS transistors NT31 and NT32 are connected to the source of the reference potential VSS.

The gate of the PMOS transistor PT31 is connected to the positive input terminal TI+. The drain of the PMOS transistor PT31 is connected to the drain of the NMOS transistor NT31 at a connection point. A node ND31 is configured using the connection point.

The gate of the PMOS transistor PT32 is connected to the negative input terminal TI−. The drain of the PMOS transistor PT32 is connected to the drain of the NMOS transistor NT32 at a connection point. A node ND32 is configured using the connection point.

The gate of the NMOS transistor NT31 is connected to the node ND32, and the gate of the NMOS transistor NT32 is connected to the node ND31.

The node ND31 is connected to an input of the output buffer part 1832, and the node ND32 is connected to an input of the output buffer part 1833.

The output buffer part 1832 includes PMOS transistors PT33 and PT34, NMOS transistors NT33 and NT34, and a negative output terminal TO−.

The sources of the PMOS transistors PT33 and PT34 are connected to a terminal TVMAX for supplying the maximum voltage value VMAX for the delay element 182.

The sources of the NMOS transistors NT33 and NT34 are connected to a terminal TVMIN for supplying the minimum voltage value VMIN for the delay element 182.

The drain of the PMOS transistor PT33 is connected to the drain of the NMOS transistor NT33 at a connection point. A node ND33 is configured using the connection point.

The drain of the PMOS transistor PT34 is connected to the drain of the NMOS transistor NT34 at a connection point. A node ND34 is configured using the connection point.

The gate of the PMOS transistor PT33 and the gate of the NMOS transistor NT33 are connected to the node ND31 of the input differential circuit 1831.

The gate of the PMOS transistor PT34 and the gate of the NMOS transistor NT34 are connected to the node ND33. The node ND34 is connected to the negative output terminal TO−.

In other words, two CMOS inverters are cascaded between the node ND31 and the output terminal TO−, thereby configuring the output buffer part 1832.

The output buffer part 1833 includes PMOS transistors PT33 and PT34, NMOS transistors NT33 and NT34, and a positive output terminal TO+.

The sources of the PMOS transistors PT35 and PT36 are connected to a terminal TVMAX for supplying the maximum voltage value VMAX for the delay element 182.

The sources of the NMOS transistors NT35 and NT36 are connected to a terminal TVMIN for supplying the minimum voltage value VMIN for the delay element 182.

The drain of the PMOS transistor PT35 is connected to the drain of the NMOS transistor NT35 at a connection point. A node ND35 is configured using the connection point.

The drain of the PMOS transistor PT36 is connected to the drain of the NMOS transistor NT36 at a connection point. A node ND36 is configured using the connection point.

The gate of the PMOS transistor PT35 and the gate of the NMOS transistor NT35 are connected to the node ND32 of the input differential circuit 1831.

The gate of the PMOS transistor PT36 and the gate of the NMOS transistor NT36 are connected to the node ND35. The node ND36 is connected to the positive output terminal TO+.

In other words, two CMOS inverters are cascaded between the node ND32 and the output terminal TO+, thereby configuring the output buffer part 1833.

The input level shifter 183 inverts, using the input differential circuit 1831, the level of a voltage corresponding to a data item that is input to the positive input terminal TI+, and adjusts, using the output buffer part 1832, the amplitude of the voltage corresponding to the data item so that the amplitude falls within the input voltage range of the delay element 182 which is provided at the stage subsequent to the input level shifter 183. The input level shifter 183 outputs the data item from the negative output terminal TO−.

Furthermore, the input level shifter 183 inverts, using the input differential circuit 1831, the level of a voltage corresponding to a data item that is input to the negative terminal TI−, and adjusts, using the output buffer part 1833, the amplitude of the voltage corresponding to the data item so that the amplitude falls within the input voltage range of the delay element 182 which is provided at the stage subsequent to the input level shifter 183. The input level shifter 183 outputs the data item from the positive output terminal TO+.

The output level shifter 184 shifts the amplitudes of output voltages corresponding to data items which are output from the delay element 182 back to the amplitudes of voltages (VDD−VSS) for data items, and converts differential outputs into a single output.

Figure 9:
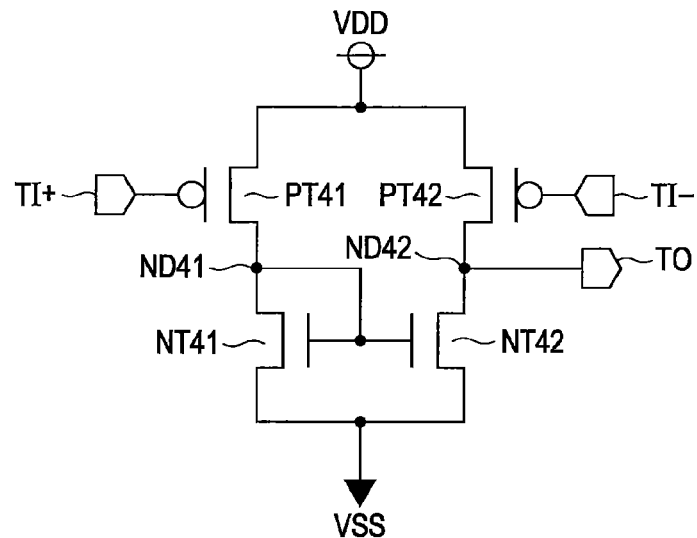
FIG. 9 is a circuit diagram showing an example of a configuration of an output level shifter that is applied in the delay circuit in the first embodiment.

FIG. 9 is a circuit diagram showing an example of a configuration of the output level shifter 184 that is applied in the delay circuit 181 in the first embodiment.

The output level shifter 184 shown in FIG. 9 includes PMOS transistors PT41 and PT42, NMOS transistor NT41 and NT42, a positive input terminal TI+, a negative input terminal TI−, and an output terminal TO.

The sources of the PMOS transistors PT41 and PT42 are connected to the source supplying the power supply voltage VDD. The sources of the NMOS transistors NT41 and NT42 are connected to the source of the reference potential VSS.

The gate of the PMOS transistor PT41 is connected to the positive input terminal TI+. The drain of the PMOS transistor PT41 is connected to the drain of the NMOS transistor NT41 at a connection point. A node ND41 is configured using the connection point.

The gate of the PMOS transistor PT42 is connected to the negative input terminal TI−. The drain of the PMOS transistor PT42 is connected to the drain of the NMOS transistor NT42 at a connection point. A node ND42 is configured using the connection point.

The gates of the NMOS transistors NT41 and NT42 are connected to the node ND41. The node ND42 is connected to the output terminal TO.

As described above, the output level shifter 184 having the above-described configuration shifts the amplitudes of output voltages corresponding to data items which are output from the delay element 182 back to the amplitudes of voltages (VDD−VSS) for data items, and converts differential outputs into a single output.

The clocked inverters 185 and 186 are set to be in an operation state when the level of the standby signal STB is low for deassertion, thereby inverting and outputting input data items.

When the level of the standby signal STB is high, the switch 188 is turned on and the switch 189 is turned off, thereby directly transferring an output from the buffer BF181 to the side of the output level shifter 184 in a path for an input data item.

In other words, when the level of the standby signal STB is high for assertion, the switch 188 causes a path from the clocked inverters 185 and 186 to the output level shifter 184 via the input level shifter 183 and the delay element 182 to be bypassed in the path for an input data item.

When the level of the standby signal STB is low, i.e., when the level of an output from the inverter 187 is high, the switch 189 is in an on-state, thereby transmitting an output from the output level shifter 184 to the output terminal TDOUT via the buffer BF182.

When the level of the standby signal STB is high, i.e., when the level of the output from the inverter 187 is low, the switch 189 is in an off-state. In the off-state, the output side of the output level shifter 184 is held so that it is in a high impedance state.

Here, an operation of the delay timing adjustment circuit 210 in the data transfer circuit 200 having the above-described configuration will be described with reference to FIG. 10, parts (A) to (D) of FIG. 11, and parts (A) to (D) of FIG. 12.

Figure 10:
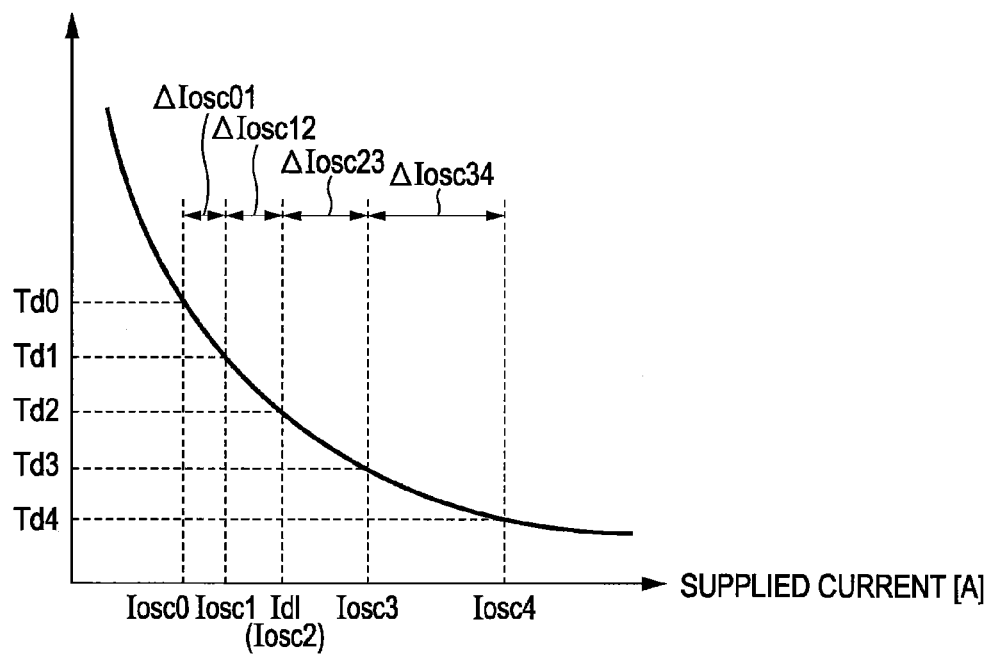
FIG. 10 is a graph for explaining a relationship between delay time and supplied current.

FIG. 10 is a graph for explaining a relationship between delay time Td and the supplied current Iosc.

FIG. 11 including parts (A) to (D) is a timing diagram in a case of the normal operation.

FIG. 12 including parts (A) to (D) is a timing diagram in a case of the standby operation.

The PLL circuit 160 performs frequency division using the master clock MCK with the input frequency divider 161 to obtain the reference clock RCLK so that the frequency of the reference clock RCLK is equal to a comparison frequency. Then, the PLL circuit 160 detects, using the phase comparator 162, the phase difference between the reference clock RCLK and the feedback clock FCLK that is supplied from the feedback frequency divider 166.

The detected phase difference is converted by the charge pump 163 and the loop filter 164 from a result based on a time axis to a result based on a voltage axis.

The oscillation signal CLK that is output from the voltage control oscillator 165 is supplied to the feedback frequency divider 166. In the feedback frequency divider 166, frequency division is performed using the oscillation signal CLK to obtain the feedback clock FOLK so that the frequency of the feedback clock FOLK is equal to the comparison frequency. The feedback clock FCLK is fed back to the phase comparator 162. Then, when the phase of the feedback clock FCLK is synchronized, at a frequency, with the phase of the reference clock RCLK that is obtained by performing frequency division using the master clock MCK, the frequency is locked.

With the above-described feedback control, even when change in temperature, fluctuation in the power supply voltage, variations in thresholds of transistors, or the like occurs, the locked frequency is constant. A phase difference that occurs in the voltage control oscillator is stabilized without being influenced by any one of the change in temperature, the fluctuation in the power supply voltage, and the variations in thresholds of transistors.

In the first embodiment, the phase difference is used as a reference value of the delay time of the delay circuit 181.

The locked frequency is determined in accordance with the frequency of the master clock MCK, the division number of the feedback frequency divider 166, the gain of the voltage control oscillator 165, the output current of the charge pump 163, and the transfer function of the loop filter 164.

Note that the locked frequency of the PLL circuit 160 is not directly used for the delay time in the delay timing adjustment circuit 210. Thus, any frequency can be used as the locked frequency.

The delay circuit 181 receives, from the voltage control oscillator 165 of the PLL circuit 160, the current Idl that is generated using the oscillation delay elements OSCD1 to OSCD3.

The current Idl is generated, using current mirror, as a copy of a current that is supplied to the oscillation delay elements OSCD1 to OSCD3. Accordingly, a phase difference that occurs in the delay element 182 of the delay circuit 181 is the same as a phase difference that occurs in one of the oscillation delay elements OSCD1 to OSCD3 of the PLL circuit 160.

Thus, the phase difference that occurs in the delay element 182 of the delay circuit 181 is also not influenced by the change in temperature, the fluctuation in the power supply voltage, and the variations in thresholds of transistors as in the case of the PLL circuit 160.

As shown in FIGS. 5 and 6, the delay timing adjustment circuit 210 can slightly adjust, using each of the current adjustment units (delay adjustment units) 170, the current Idl that is supplied from the PLL circuit 160.

In the examples shown in FIGS. 5 and 6, the following relationship between the delay time Td and the current Iosc that is supplied to the delay element 182 is established.

$$\Delta Td \propto 1/\sqrt{\Delta Iosc} \quad (1)$$

According to Relationship (1), as described below, the delay time Td can be adjusted so as to have a linear characteristic by controlling the current Iosc using the current adjustment unit (delay adjustment unit) 170.

$$\Delta Iosc = Idl/\Delta K \quad (2)$$

Here, K is a current adjustment coefficient of the current adjustment unit (delay adjustment unit) 170. Idl is a current that is supplied from the PLL circuit 160 to the current adjustment unit (delay adjustment unit) 170.

Here, when Relationship (2) is substituted into Relationship (1), the following relationship can be obtained.

$$\Delta Td \propto \sqrt{\Delta K}/\sqrt{\Delta Idl} \quad (3)$$

Because $\sqrt{\Delta Idl}$ is a constant, the following relationship can be obtained when Relationship (3) is transformed.

$$\therefore \Delta Td \propto \sqrt{\Delta K} \quad (4)$$

A linear relationship is obtained between the delay time Td and the square root of the current adjustment coefficient K of the current adjustment unit (delay adjustment unit) 170.

FIG. 10 is a graph of the relationship between the supplied current Iosc and the delay time Td.

As shown in FIGS. 5 and 6, the current adjustment unit (delay adjustment unit) 170 has a current mirror configuration, and is configured so that a mirror ratio can be set so as to be adjustable using the data-delay control signal DDCTL which is supplied from an external unit.

The mirror ratio corresponds to K.

Because the current adjustment unit (delay adjustment unit) 170 is configured so that the mirror ratio for current mirror can be switched using the data-delay control signal DDCTL, even a square root characteristic can be realized by appropriate selection of the mirror ratio K.

For example, when the mirror ratio K is switched to 1, 4, 9, 16, 25, . . . , the square root of the mirror ratio K becomes 1, 2, 3, 4, 5, . . . , respectively. Accordingly, linear increase in ΔTd can be verified.

As shown in the circuit example of the current adjustment unit (delay adjustment unit) 170 illustrated in FIG. 6, the current adjustment unit (delay adjustment unit) 170 is a circuit that is controlled by a six-bit control signal. However, the number of bits of the control signal is not limited to six bits. The number of bits can be adjusted so as to be suitable for ΔTd.

As described above, in a case of the normal operation (not in a case of the standby operation), a data item is subjected to timing adjustment by the delay circuit 181, and the data item is output to a corresponding one of the transmission lines 400 via the output interface unit 150.

When the delay circuit 181 is not used, the level of the standby signal STB is set to be high, and the standby signal STB is input, thereby transferring a signal using a path in which the input level shifter 183, the delay element 182, and the output level shifter 184 of the delay circuit 181 are bypassed.

In this case, the path for an input data item in the delay circuit 181 can be switched to a path utilizing only the delays of the buffers.

In this case, the input level shifter 183, the delay element 182, and the output level shifter 184 enter a standby state together, whereby power consumption can be reduced.

Note that the output terminal of the input level shifter 183 is set so as to have a high impedance.

For example, when the data rate of the CMOS image sensor is reduced, it is supposed that the number of output channels is reduced together with the data rate. The output channels that are targeted for reduction in the number of output channels are set to be in the standby state, whereby the power consumption can be reduced.

As described above, part (A) to (D) of FIG. 11 and part (A) to (D) of FIG. 12 illustrate input/output relationships in a case in which the delay circuit operates and input/output relationships in a case in which the delay circuit is bypassed, respectively.

When the level of the standby signal STB is low, an input data item DATAIN is transmitted via the input level shifter 183, the delay element 182, and the output level shifter 184. Accordingly, an output data item DATAOUT is output in a state in which the output data item DATAOUT is delayed from the input data item DATAIN by the delay time td that is in proportion to the mirror ratio K which is set using the data-delay control signal DDCTL.

When the level of the standby signal STB is high, the input level shifter 183, the delay element 182, and the output level shifter 184 enter the standby state, and the delay time Td becomes approximately zero.

As described above, in the first embodiment, the delay timing adjustment circuit 210 has the built-in PLL circuit 160. A delay element that is equivalent to one of the oscillation delay elements of the PLL circuit 160 is used as the delay element 182 of the delay circuit 181, whereby the delay time that does not depend on change in temperature, fluctuation in the power supply voltage, and variations in thresholds of transistors can be generated.

Furthermore, the delay timing adjustment circuit 210 includes the delay adjustment units 170, each of which adjusts the current that is to be supplied to the delay element 182 of a corresponding one of the delay circuit 181. When the delay timing adjustment circuit 210 is applied to a multichannel interface, the delay times can be set independently from one another so that each of the delay times is provided for a corresponding one of the delay circuits.

In the delay timing adjustment circuit 210, the number of circuits that are disposed on the individual data lines DTL0 to DTLp is smaller than the number of circuits in a case in which DLL circuits are disposed on the individual data lines DTL0 to DTLp. Accordingly, the delay timing adjustment circuit 210 can be miniaturized, compared with the case in which DLL circuits are disposed, and the delay timing adjustment circuit 210 is suitable for a device in which miniaturization of peripheral circuits is necessary such as an image sensor.

In the delay timing adjustment circuit 210, the phase difference that occurs in the oscillation delay elements OSCD1 to OSCD3 which are provided in the PLL circuit 160 is not directly used for the delay times. Accordingly, any frequency can be determined as the locked frequency of the PLL circuit 160 without depending on the delay times, and the degree of difficulty of design of the PLL circuit 160 can be reduced.

Note that the CMOS image sensor according to the first embodiment is not limited to a particular CMOS image sensor. For example, the CMOS image sensor according to the first embodiment can be configured as a CMOS image sensor in which column-parallel analog-to-digital converters (column ADCs) are mounted.

The solid-state image pickup element having the above-described positive effects can be applied as an image pickup device for a digital camera or a camcorder.

Second Embodiment

Figure 13:
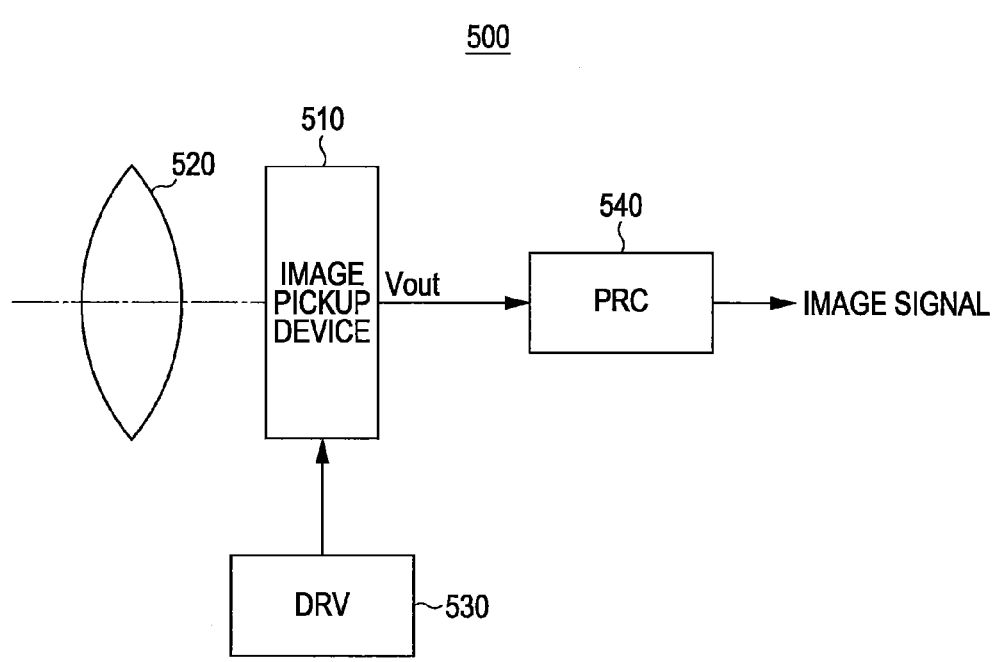
FIG. 13 is a diagram showing an example of a configuration of a camera system in which the solid-state image pickup element according to the first embodiment of the present invention is applied.

FIG. 13 is a diagram showing an example of a configuration of a camera system in which the solid-state image pickup element according to the first embodiment of the present invention is applied.

As shown in FIG. 13, a camera system 500 includes an image pickup device 510 as which the CMOS image sensor (solid-state image pickup element) 100 according to the first embodiment of the present invention can be applied.

The camera system 500 further includes an optical system that leads incident light into a pixel region of the image pickup device 510 (that forms an image of an object), e.g., a lens 520 that forms an image using incident light (image light) on an image pickup face.

Additionally, the camera system 500 includes a drive circuit (DRV) 530 that drives the image pickup device 510, and a signal processing circuit (PRC) 540 that processes an output signal that is output from the image pickup device 510.

The drive circuit 530 includes a timing generator (not illustrated) that generates various types of timing signals including a start pulse and a clock pulse with which circuits in the image pickup device 510 are driven. The drive circuit 530 drives the image pickup device 510 with a predetermined timing signal.

Furthermore, the signal processing circuit 540 performs predetermined signal processing on the output signal that is output from the image pickup device 510.

An image signal that is processed by the signal processing circuit 540 is recorded on a recording medium such as a memory. A hard copy of image information that is recorded on the recording medium is produced by a printer or the like. Additionally, the image signal that is processed by the signal processing circuit 540 is displayed as a moving image on a monitor that is configured using a liquid crystal display or the like.

As described above, in an image pickup apparatus such as a digital still camera, the above-described solid-state image pickup element 100 is mounted as the image pickup device 510, whereby a low-power high-precision camera can be realized.

The present application contains subject matter related to that disclosed in Japanese Priority Patent Application JP 2008-303070 filed in the Japan Patent Office on Nov. 27, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state image pickup element comprising:
a timing adjustment circuit, the timing adjustment circuit including:
at least one data line;

a phase synchronization circuit that includes a plurality of oscillation delay elements which oscillate an oscillation signal, and that is configured to oscillate the oscillation signal by synchronizing a phase of a feedback clock with a phase of a reference clock;

at least one delay circuit that includes a delay element which is disposed on the data line and which is equivalent to one of the plurality of oscillation delay elements, and that is configured to delay data which is to be transmitted on the data line; and a delay adjustment unit configured to adjust an amount of delay of the delay element of the delay circuit in accordance with a signal associated with oscillation of the phase synchronization circuit.

2. The solid-state image pickup element according to claim 1, wherein the data line includes a plurality of data lines, the delay circuit includes a plurality of delay circuits, each of the plurality of delay circuits being disposed on a corresponding one of the plurality of data lines, and the delay adjustment unit includes a plurality of delay adjustment units, and wherein the plurality of delay adjustment units are disposed independently from one another so that each of the plurality of delay adjustment units is provided for a corresponding one of the plurality of delay circuits, and each of the plurality of delay adjustment units adjusts an amount of delay of the delay element of a corresponding one of the plurality of delay circuits in accordance with a signal associated with oscillation of the phase synchronization circuit for a corresponding data channel.

3. The solid-state image pickup element according to claim 1, wherein the phase synchronization circuit includes a voltage control oscillator configured to perform an oscillation operation by supplying a current to the plurality of oscillation delay elements, the current being obtained by a current mirror circuit that receives a voltage which is set in accordance with a result of comparison between the phase of the reference clock and the phase of the feedback clock, and wherein the delay adjustment unit supplies, to the delay element as an adjustment signal for adjusting the amount of delay of the delay element, a current that is set in accordance with the current that is obtained by the current mirror circuit of the phase synchronization circuit.

4. The solid-state image pickup element according to claim 3, wherein the delay adjustment unit has a function of being capable of slightly adjusting, in accordance with a control signal, the current that is to be supplied to the delay element.

5. The solid-state image pickup element according to claim 1, wherein the delay circuit includes at least, an input level shifter that is disposed at an input side of the delay element, that is configured to adjust a level of a voltage corresponding to data, which is input, so that the level of the voltage falls within an input voltage range of the delay element, and that is configured to supply, to the delay element, the data corresponding to the voltage whose level has been adjusted, an output level shifter configured to shift an output amplitude of the voltage corresponding to the data, which is output from the delay element, back to an amplitude of a voltage for the data, and a bypass circuit configured to transmit the data, which is input, to an output side of the output level shifter by bypassing a data path from the input level shifter to the output level shifter via the delay element.

6. The solid-state image pickup element according to claim 5, wherein the bypass circuit has a function of holding the output side of the output level shifter so that the output side of the output level shifter has a high impedance.

7. A camera system comprising:

a timing adjustment circuit, the timing adjustment circuit including:

at least one data line;

a phase synchronization circuit that includes a plurality of oscillation delay elements which oscillate an oscillation signal, and that is configured to oscillate the oscillation signal by synchronizing a phase of a feedback clock with a phase of a reference clock;

at least one delay circuit that includes a delay element which is disposed on the data line and which is equivalent to one of the plurality of oscillation delay elements, and that is configured to delay data which is to be transmitted on the data line; and a delay adjustment unit configured to adjust an amount of delay of the delay element of the delay circuit in accordance with a signal associated with oscillation of the phase synchronization circuit.

8. The camera system according to claim 7, wherein the data line includes a plurality of data lines, the delay circuit includes a plurality of delay circuits, each of the plurality of delay circuits being disposed on a corresponding one of the plurality of data lines, and the delay adjustment unit includes a plurality of delay adjustment units, and wherein the plurality of delay adjustment units are disposed independently from one another so that each of the plurality of delay adjustment units is provided for a corresponding one of the plurality of delay circuits, and each of the plurality of delay adjustment units adjusts an amount of delay of the delay element of a corresponding one of the plurality of delay circuits in accordance with a signal associated with oscillation of the phase synchronization circuit for a corresponding data channel.

9. The camera system according to claim 8, wherein the phase synchronization circuit includes a voltage control oscillator configured to perform an oscillation operation by supplying a current to the plurality of oscillation delay elements, the current being obtained by a current mirror circuit that receives a voltage which is set in accordance with a result of comparison between the phase of the reference clock and the phase of the feedback clock, and wherein the delay adjustment unit supplies, to the delay element as an adjustment signal for adjusting the amount of delay of the delay element, a current that is set in accordance with the current that is obtained by the current minor circuit of the phase synchronization circuit.

10. The camera system according to claim 9, wherein the delay adjustment unit has a function of being capable of slightly adjusting, in accordance with a control signal, the current that is to be supplied to the delay element.

11. The camera system according to claim 8, wherein the delay circuit includes at least, an input level shifter that is disposed at an input side of the delay element, that is configured to adjust a level of a voltage corresponding to data, which is input, so that the level of the voltage falls within an input voltage range of the delay element, and that is configured to supply, to the delay element, the data corresponding to the voltage whose level has been adjusted, an output level shifter configured to shift an output amplitude of the voltage corresponding to the data, which is output from the delay element, back to an amplitude of a voltage for the data, and a bypass circuit configured to transmit the data, which is input, to an output side of the output level shifter by bypassing a data path from the input level shifter to the output level shifter via the delay element.

12. The camera system according to claim 11, wherein the bypass circuit has a function of holding the output side of the output level shifter so that the output side of the output level shifter has a high impedance.

* * * * *